Dec. 15, 1970 W. L. LEHMANN ET AL 3,548,315

COMPENSATED VHF-UHF AUTOMATIC GAIN CONTROL DELAY SYSTEM

Filed March 1, 1968

Inventors:
WILLIAM L. LEHMANN &
JAMES C. MARSH, Jr.

By Eugene M. Whitacre
Attorney

United States Patent Office 3,548,315
Patented Dec. 15, 1970

3,548,315
COMPENSATED VHF-UHF AUTOMATIC GAIN CONTROL DELAY SYSTEM

William L. Lehmann and James C. Marsh, Jr., Indianapolis, Ind., assignors to RCA Corporation, a corporation of Delaware Filed Mar. 1, 1968, Ser. No. 709,703
Int. Cl. H04b *1/16*
U.S. Cl. 325—410 6 Claims

ABSTRACT OF THE DISCLOSURE

Optimum noise figure and overload characteristic of a television receiver is achieved during both very high frequency (VHF) and ultra high frequency (UHF) operation by increasing the AGC delay applied to an amplifier which serves as a radio frequency amplifier for VHF reception and as an intermediate frequency amplifier for UHF reception, when the receiver is switched from VHF operation to UHF operation.

Figures 1, 2:
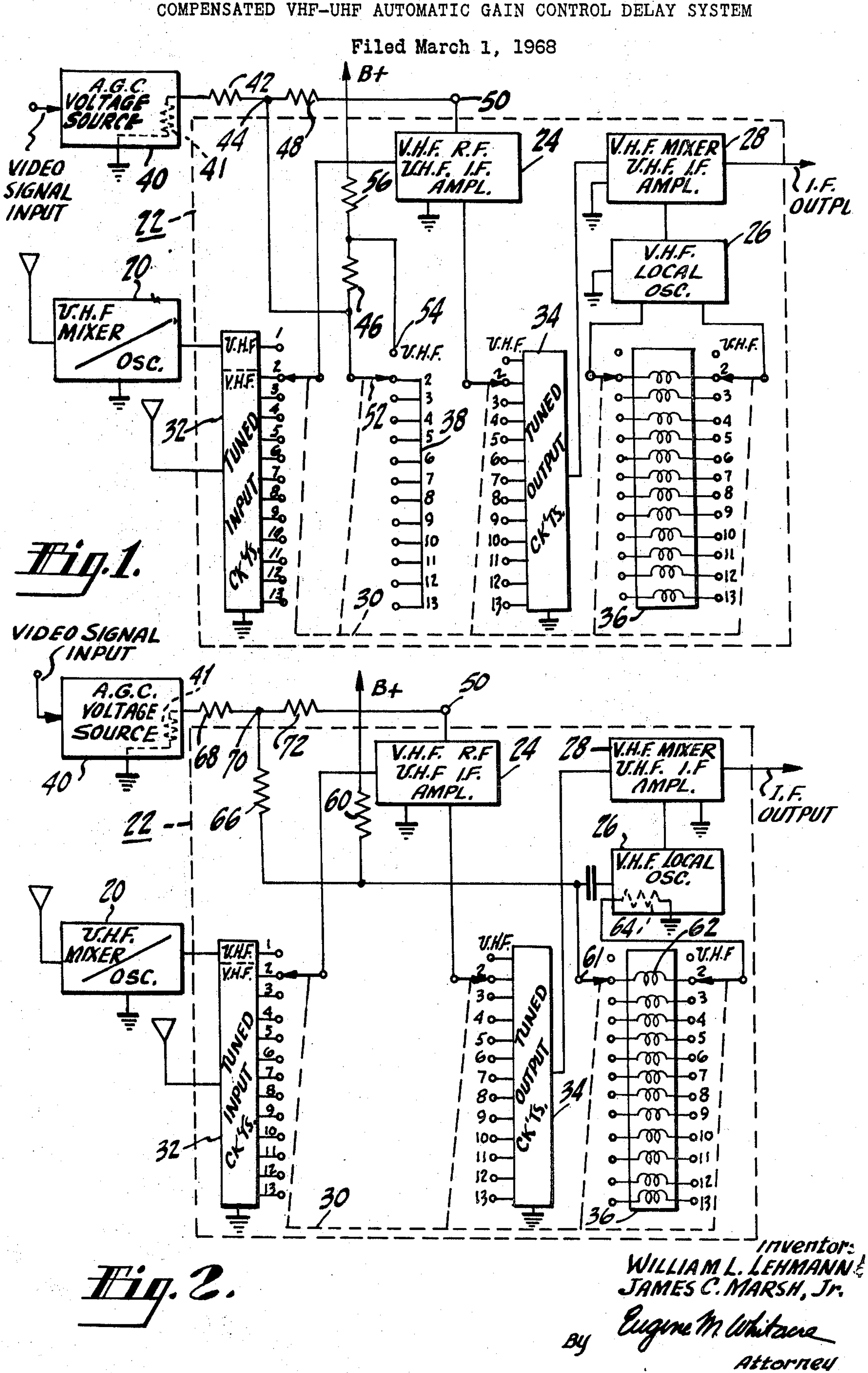

This invention relates generally to television receivers and more particularly to automatic gain control (AGC) delay circuits for VHF-UHF television receivers.

Television receivers are generally provided with an AGC system for maintaining the level of the signal applied to the video detector stage thereof substantially constant over a relatively wide range of variations in the level of a received signal. This system is operative to reduce the gain of the radio frequency (RF) and intermediate frequency (IF) amplifiers as the strength or level of a received signal increases. To obtain an acceptable signal-to-noise ratio in a given receiver, the gain control action on the RF amplifier is usually delayed relative to the AGC action on the IF amplifiers so that the RF amplifier operates at maximum gain for a range of received signals at low levels, i.e. weak signals. In order to prevent overloading of the mixer stage on strong signals, when the received signal strength reaches a predetermined level the AGC delay on the RF amplifier is overcome and the gain of the RF amplifier is then reduced.

Most television receivers currently sold in the United States are capable of receiving both VHF and UHF television signals and include separate UHF and VHF tuners. The UHF tuner typically has no RF amplifier stage, and utilizes a passive device such as a diode for converting a received UHF television signal into one of intermediate frequency. The VHF tuner, on the other hand, usually includes an RF amplifier stage which preceeds an active signal mixer stage. Automatic gain control is applied to the RF amplifier, and is delayed by an amount sufficient to achieve the desired noise figure for the receiver and to avoid overloading the stages following the RF amplifier.

To compensate for differences in gain between UHF and VHF operation, it is common practice to design the VHF tuner such that when the receiver is conditioned for UHF operation, the VHF RF amplifier and mixer stages function as first and second IF signal amplifiers respectively for processing of the converted UHF signals.

It has been found that the AGC delay on the RF amplifier for optimum noise figure and overload performance is different for UHF than for VHF operation. Thus, the AGC delay is set at the optimum value for VHF operation, thereby degrading UHF performance.

It is an object of the present invention to provide an improved delay automatic gain control system for VHF-UHF television receivers.

In accordance with the present invention means are provided for automatically changing the AGC delay when the receiver is switched from VHF to UHF operation or vice versa.

The novel features which are considered to be characteristic of this invention are set forth with particularity in the appended claims. The invention itself, however, both as to its organization and its method of operation as well as additional objects and advantages thereof will best be understood from the following description when read in connection with the accompanying drawing in which:

FIG. 1 is a schematic circuit diagram in block form of a portion of a VHF-UHF television receiver having an AGC system embodying the present invention; and FIG. 2 is a schematic circuit diagram in block form of a portion of a VHF-UHF television receiver illustrating another embodiment of the present invention.

In referring to the drawing, like elements and components are designated by like reference characters throughout the figures.

FIG. 1 shows a portion of a television receiver including a UHF tuner 20 including mixer and oscillator stages, and a VHF tuner denoted by the dashed rectangle 22. The VHF tuner 22 includes an RF amplifier 24, a local oscillator 26, a mixer stage 28, and a ganged channel and mode selector switch 30. The switch 30 may be of the rotary wafer type and will be understood by those familiar with the art to include ganged sections containing reactive circuit elements for tuning the receiver to the different television channels at which reception is desired. As representative of the switch 30, sections 32, 34 and 36 are shown for respectively tuning the input and output circuits of the RF amplifier 24 and the local oscillator 26. As will be hereinafter described in accordance with the present invention, an additional switch section 38 or existing switch contacts (as in the embodiment of FIG. 2) are used to automatically change the AGC delay to the RF amplifier stage 24 when the receiver is switched from UHF to VHF operation or vice versa.

As shown in FIG. 1, the channel selector switch is set at the VHF channel 2 position. A signal received by way of the VHF antenna is coupled via a selected resonant input network in wafer section 32 to the input of the RF amplifier 24 and then coupled via a selected resonant output network in the wafer section 34 to the VHF mixer stage 28. A selected reactive element in wafer section 36 tunes the local oscillator 26 to provide a wave of suitable frequency which upon application to the mixer 28 beats or heterodynes with the RF amplifier output signal to provide a signal of a desired intermediate frequency for processing through the remainder of the television receiver circuitry (not shown), to detect and display the received signal information in a manner known in the art.

For receiver operation in the UHF mode, the channel selector switch 30 is rotated to its UHF position (switch position 1) whereupon the VHF oscillator 26 is disabled. Signals received by way of the UHF antenna are converted by the UHF tuner 20 to corresponding signals of intermediate frequency. The intermediate frequency signal from the UHF tuner is applied via tuned circuit 32 to the amplifier 24. The circuits 32 and 34 are tuned to the intermediate frequency of the television receiver, and hence the stages 24 and 30 operate as intermediate frequency amplifiers during UHF reception.

An AGC voltage source 40 is coupled through the pair of resistors 42 and 48 to the RF amplifier 24. The AGC source by way of example, may comprise a keyed AGC stage which produces a control voltage which varies as a function of received signal level. In the present instance, the AGC voltage becomes more negative as signal level increases, and the RF amplifier stage 24 includes a vacuum tube as the active element thereof suitably biased so as to be responsive to a negative D.C. voltage coupled thereto, (noted herein as by way of the AGC input terminal 50) for effecting a decrease in the gain of the amplifier stage. It is recognized that other types of AGC circuits may be used, and the polarity direction of the AGC voltage with signal level changes depends on the type of active device used in the RF amplifier stage, and the mode (forward or reverse) of AGC being used.

A voltage divider including the resistors 56, 46, 42 and the internal direct current resistance through the AGC voltage source to ground (denoted as the dashed resistor 41) causes a positive component of voltage to be developed at the terminal 44 for coupling via resistor 48 to the AGC terminal 50 of the RF amplifier 24. This voltage when added to the negative going voltage developed by the AGC source 40 determines the AGC delay of the receiver. By selection of the voltage divider parameters, the terminal 44 may be made positive relative to ground until the receiver signal level reaches a level predetermined to provide optimum noise-overload characteristics for the receiver. The gain of the RF amplifier will not be reduced until the signal becomes sufficiently strong that the negative going AGC voltage overcomes the positive voltage at the terminal 50. The amount of delay is made long enough to insure a good noise figure for the receiver, but not too long so that the succeeding mixer will be overloaded by the signal from the RF amplifier. Such a delay system is used in RCA tuner model KRK 124V which is disclosed in Television Service Data, File 1966, No. T20, published by RCA Sales Corporation, 600 N. Sherman Drive, Indianapolis, Ind.

When the channel selector switch is rotated to the UHF position, connection is made via the wiper contact 52 and the UHF position terminal 54 on the wafer section 38 for short circuiting resistor 46, thereby affecting the division of voltage from the B+ supply and causing a higher value of positive voltage to be developed at terminal 44 than is developed thereat with the channel selector switch in a VHF position. This increase in positive voltage has the effect of increasing the "delay" or required level of received signal before the gain of the amplifier 24 is reduced. The value of the short circuited resistor 46 can be chosen relative to the other parameters of the voltage divider network to provide for an optimum AGC delay with the receiver conditioned for UHF operation. Thus it will be seen that optimum AGC delay of the amplifier stage 24 is automatically provided for both VHF and UHF operation of the receiver.

Referring now to FIG. 2, there is illustrated another embodiment of a VHF–UHF tuner arrangement incorporating the selective AGC delay switching feature of the present invention. In this embodiment, the additional wafer section 38 on switch 30 (as shown in FIG. 1) is not needed, and the selective conditioning of the amplifier 24 for optimum AGC delay is accomplished utilizing the existing switch contacts in the local oscillator wafer section 36.

More particularly now, in this embodiment, during VHF operation, the positive voltage coupled to the AGC terminal 50 is taken from a voltage division of the B+ operating potential applied to the VHF local oscillator 26. As can be seen from FIG. 2, a voltage divider network is set up by the series connected application of the oscillator B+ operating potential through resistor 60, wiper 61 to a selected one of the switched oscillator tuning reactive elements 62 for VHF channels 2 through 13, and the internal direct current resistance to ground (denoted as across the dashed resistor 64) through the oscillator 26 during operation thereof. The division of the B+ operating potential is also affected by the direct current series path from the wiper terminal 61, through resistors 66 and 68 and the internal direct current resistance through the AGC voltage source 40 to ground (denoted by the dashed resistor 41). The positive D.C. voltage developed at terminal 70 is coupled via a resistor 72 to the amplifier 24 AGC input terminal 50. This voltage when added to a negative going voltage developed by the AGC source 40 and coupled through resistors 68 and 72 to the AGC terminal 50 determines the AGC delay of the amplifier 24 in a manner similar to that which was hereinabove described with reference to FIG. 1.

With the channel selector switch 30 in the UHF position it will be seen that the series resistance divider network through the oscillator 26 is broken. This causes an increase in the positive voltage applied to the resistors 66, 68 and AGC source internal resistance 41 divider path, thereby increasing the value of positive voltage developed at terminal 70 and providing an increase in the AGC delay of the amplifier 24.

It will thus be apparent that by proper choice of the voltage divider parameters, optimum AGC delay of amplifier 24 is automatically provided for both VHF and UHF operation of the receiver.

What is claimed is:

1. In a television receiver of the type including a VHF tuner having a plurality of VHF channel selecting positions and a UHF position, a UHF tuner for converting a received UHF television signal to a corresponding signal of intermediate frequency, amplifier means, means connecting said amplifier means to said VHF tuner to operate as a radio frequency amplifier for received VHF television signals when said VHF tuner is in one of said plurality of VHF channel selecting positions, means connecting said amplifier means to said UHF tuner to operate as an intermediate frequency amplifier for a converted UHF signal when said VHF tuner is in said UHF position, means providing a source of automatic gain control potential having an amplitude which varies as a function of received signal level, automatic gain control delay means coupling said source of automatic gain control potential to said amplifier means to delay the reduction in gain of said amplifier means until the received signal has increased beyond a predeterined level when said VHF tuner is in one of said VHF channel selecting positions; the improvement comprising:

mean for changing the amount of delay in reducing the gain of said amplifier means when said VHF tuner is switched from one of said plurality of VHF channel selecting positions to said UHF position.

2. A television receiver of the type defined in claim 1 wherein the reduction in gain of said amplifier means is delayed until the received signal has increased to a greater level than said predetermined level when said VHF tuner is in said UHF position.

3. In a television receiver including tuner means responsive to both VHF and UHF television signals, said tuner means including an amplifier having input means adapted to receive a D.C. control signal operative to reduce the gain of said amplifier as the level of the received control signal increases, means coupling an output D.C. gain control signal representative of the level of a received television signal to said input means, and a switch adapted to selectively condition said tuner means into a VHF or UHF operating mode, the improvement comprising:

first means coupled to said amplifier input means and providing a first fixed D.C. control signal of a polarity opposite to said gain control signal when said tuner means is in one of said operating modes; and second means connected between said switch and said first means for providing a second fixed D.C. control signal of a polarity opposite to said gain control signal and coupled to said amplifier input means upon the operation of said switch to select the other of said operating modes.

4. In a television receiver including tuner means responsive to both VHF and UHF television signals, said tuner means including an amplifier having input means adapted to receive a D.C. control signal operative to reduce the gain of said amplifier as the level of the received control signal increases, means coupling an output D.C. gain control signal representative of the level of a received television signal to said input means, and a switch adapted to selectively condition said tuner means into a VHF or UHF operating mode, the improvement comprising:

a source of operating potential of a polarity opposite to said gain control signal;

first and second resistors;

means connecting said first and second resistors in series connected D.C. circuit path between said operating potential source and said amplifier input means; and means connected between said switch and one of said resistors for establishing a short circuit path across said one resistor upon the operation of said switch to select said UHF operating mode.

5. In a television receiver of the type including a UHF tuner for converting a received UHF television signal to a corresponding signal of intermediate frequency, a VHF tuner having a plurality of VHF channel selecting positions and a UHF position, said VHF tuner having first means adapted to operate as a radio frequency amplifier for received VHF television signals when said VHF tuner is in one of said plurality of VHF channel selecting positions and to operate as an intermediate frequency amplifier for a converted UHF signal when said VHF tuner is in said UHF position, means providing a source of automatic gain control potential having an amplitude which varies as a function of received signal level, and first automatic gain control delay means coupling said source of automatic gain control potential to said first means to delay the reduction in gain of said radio frequency amplifier until the received signal has increased beyond a first predetermined level when said VHF tuner is in one of said VHF channel selecting positions, the improvement comprising:

second automatic gain control delay means coupling said source of automatic gain control delay potential to said first means to delay the reduction in gain of said intermediate frequency amplifier until the received signal has increased beyond a second predetermined level when said VHF tuner is in said UHF position, said second predetermined level being greater than said first predetermined level.

6. In a signal receiver adapted to process a selected one of two signals each within a different frequency range, including an amplifier selectively operable to amplify one of said two signals, and further including an automatic gain control circuit to reduce the gain of said amplifier as the level of the received control signal increases, the combination comprising:

first means connected to said amplifier providing a first fixed D.C. control signal to delay said gain control signal until the received signal has increased beyond a first predetermined level when said amplifier is conditioned for processing the first of said two signals;

second means connected to said amplifier providing a second and different fixed D.C. control signal to delay said gain control signal until the received signal has increased beyond a second predetermined level when said receiver is conditioned for processing the second of said two signals; and said second predetermined received signal level, being greater than said first predetermined received signal level.

References Cited

UNITED STATES PATENTS 2,105,641 1/1938 Drake ------------- 325—410

ROBERT L. RICHARDSON, Primary Examiner

U.S. Cl. X.R.

178—7.3; 325—461